(12) United States Patent
Birkner et al.

(10) Patent No.: US 8,044,682 B2
(45) Date of Patent: Oct. 25, 2011

(54) FPGA HAVING LOW POWER, FAST CARRY CHAIN

(75) Inventors: John Birkner, Woodside, CA (US); Andrew Ka Lab Chan, Palo Alto, CA (US)

(73) Assignee: Siliconblue Technologies Corporation, Santa Clara, CA (US)

( * ) Notice: Subject to any disclaimer, the term of this patent is extended or adjusted under 35 U.S.C. 154(b) by 64 days.

(21) Appl. No.: 12/476,155

(22) Filed: Jun. 1, 2009

(65) Prior Publication Data

US 2010/0301898 A1 Dec. 2, 2010

(51) Int. Cl.
*H03K 19/173* (2006.01)
*H03K 19/21* (2006.01)

(52) U.S. Cl. ............................. 326/41; 326/38; 326/47

(58) Field of Classification Search ............. 326/38–41; 708/708, 707, 710
See application file for complete search history.

(56) References Cited

U.S. PATENT DOCUMENTS

| | | | | |
|---|---|---|---|---|
| 5,359,242 | A * | 10/1994 | Veenstra | 326/39 |
| 5,617,021 | A * | 4/1997 | Goetting et al. | 324/158.1 |
| 6,346,824 | B1 * | 2/2002 | New | 326/39 |
| 7,164,290 | B2 * | 1/2007 | Schlacter | 326/40 |
| 7,265,576 | B1 * | 9/2007 | Kondapalli et al. | 326/38 |
| 7,284,029 | B2 * | 10/2007 | Belluomini et al. | 708/708 |

* cited by examiner

*Primary Examiner* — Shawki Ismail
*Assistant Examiner* — Crystal L Hammond
(74) *Attorney, Agent, or Firm* — Innovation Counsel LLP

(57) ABSTRACT

An in-FPGA carry chain is provided that does not exhibit significant leakage current. In particular, parts of the carry chain can be switched on/off when desired. In this manner, carry chain parts can have their leakage currents substantially disabled when they are not in use, thus saving power. Additionally, there is provided a carry chain whose logic is separate from the other parts (e.g., LUTs) of the logic blocks that perform the remaining arithmetic functions, and whose inputs are the input data to be added, rather than data that is output in delayed fashion from the other parts (e.g., LUTs) of the logic blocks. Such a configuration reduces latency by allowing the carry chain to operate directly on the received input data without need to wait on results from the other parts (e.g., LUTs) of the logic blocks.

18 Claims, 5 Drawing Sheets

FPGA HAVING LOW POWER, FAST CARRY CHAIN

FIELD OF INVENTION

This disclosure of invention relates generally to field programmable gate arrays (FPGAs). More specifically, this disclosure relates to FPGAs with low power, fast carry chains.

BACKGROUND

The rise in popularity of portable electronic devices has led to a corresponding increase in demand for low-power FPGAs. For instance, it is increasingly desirable for hand-held devices to utilize low-power FPGA controllers that do not detract from long battery life. Ongoing efforts therefore exist to develop and refine FPGAs that consume less power, and are thus more compatible with portable and hand-held applications. Such ongoing efforts may include those that heretofore were not publically known and thus, it is to be understood that this Background section may include concepts and teachings that are not part of the prior art.

Concurrently, performance demands on such portable electronic devices continue to increase. Therefore, FPGAs used in these devices should desirably be structured to not only consume less power, but also to exhibit higher performance (e.g., high switching speeds). Accordingly, the ongoing efforts that currently exist include efforts to develop low-power FPGAs that also exhibit higher performance.

One heretofore and generally overlooked area in the ongoing efforts is FPGA carry chains, e.g., the logic used for generating and moving carry bits between successive stages during addition/subtraction operations. In particular, conventional FPGA carry chains typically consume excessive power and/or perform relatively slowly. As one example, FIG. 1 illustrates a plurality of FPGA Configurable Logic Blocks (CLBs) configured and interconnected for implementing a conventional ripple carry adder. Each configurable logic block $10$ (e.g., CLB $10_0$) receives two addend input bits (e.g., I0, I1), along with a corresponding carry bit, e.g., $C_0$ from a previous stage and the respective CLB $(10_k)$ is configured to produce a respective sum bit $S_k$ (k=0, 1, 2, etc.). Thus, the bottom logic block $10_0$ of FIG. 1 adds corresponding input bits $I0_{(0)}$, $I1_{(0)}$, along with corresponding carry bit $C_0$, to produce the respective sum bit $S_0$ and the output carry bit $C_1$, where the output carry bit is a 0 or 1 depending on the result of the addition of $I0_{(0)}$, $I1_{(0)}$ and $C_0$. The output carry bit $C_1$ is then transmitted to the next configurable logic block $10$ (e.g., CLB $10_1$), where it is used in calculating the next sum bit $S_1$, and so on. It can be observed that, due to the ripple up way in which signals are generated and forwarded to the next successive stage, the dependency of the more significant stages (e.g., CLB $10_3$) on receiving valid (e.g., settled) results from carry operations of the less significant stages (e.g., CLB $10_0$) in this ripple carry adder contributes to latency and delay given that each previous carry bit must settle into a correct state before the next addition operation can commence in the next more significant stage. That is, each logic block $10(k)$ must wait for the carry output bit from the previous logic block $10(k-1)$ to be fully determined (e.g., well settled into a deterministic state). This delay is detrimental to the performance of FPGAs that employ such ripple carry adders. Furthermore, such, inside-the-CLB and ripple-based carry logic generally exhibits detrimental leakage current, leading to power drain even when a carry operation is not being actively performed inside the CLB.

As another example of conventional design, FIG. 2 illustrates an FPGA where its configurable logic blocks (e.g., CLBs $20_0$-$20_3$, $30$) are programmed to implement a conventional carry look-ahead adder. Each logic block $20$ adds together its correspondingly received inputs $I0_{(k)}$, $I1_{(k)}$ together, along with its received carry bit $C_{(k)}$, and outputs the respective sum bit $S_{(k)}$. The logic blocks $20$ also output respective propagate and generate signals $PG_{(k)}$ to a carry look-ahead block $30$, where the state of $PG_{(k)}$ is based on whether a carry is to be further propagated from a less significant stage or a carry is to be generated at that stage (CLB $20_k$). The carry look-ahead block $30$ determines from the PG signals whether a carry is to be propagated to the next block, and sends carry signal $C_{(k)}$ accordingly to stages $20_1$-$20_4$, (last stage not shown). However, while the carry look-ahead adder helps reduce the problem of latency, the carry look-ahead block $30$ still requires some time to process the PG signals and to generate the correct set of carry signals C for generating a correct final sum signal, $S_0$:$S_n$. Additionally, the carry look-ahead adder, like the ripple carry logic, typically exhibits a leakage current even when unused for performing addition operations.

SUMMARY

Embodiments in accordance with the present disclosure of invention can be implemented in a number of ways.

In one embodiment, a field programmable gate array (FPGA) comprises a carry bits generating chain of logic units configured to execute a carry bits generating operation which is independent of a parallel, sum bits generating operation in the FPGA, where each of the carry logic units further comprises a drain voltage supply terminal and a ground sink terminal, where the drain voltage supply and ground sink terminals are capable of supporting an empowering current flowing through the carry logic unit from the drain voltage supply terminal to the ground sink terminal. Each carry bit generating logic unit also includes an empowering current flow switching transistor connected to the ground sink terminal of the carry logic unit, where the switching transistor is structured and interposed so as to support flow of the unit empowering current through the respective carry bit generating logic unit. Also included is a programmable switch connected to a gate terminal of the switching transistor and configured to disable the unit empowering current by switching off a unit empowering control signal applied to the gate terminal of the unit empowering switching transistor.

In one embodiment, the field programmable gate array (FPGA) logic cells (configurable logic blocks) each comprises a lookup table (LUT) having first and second LUT inputs for receiving externally supplied data, and a LUT output for transmitting a result of an operation performed by the LUT on the received data. Also included in the given embodiment is a chain of the carry logic units connected for facilitating carry operations for the result, with the carry logic units each having respective first, second and third unit inputs and a corresponding unit output. The first and second inputs of the carry logic unit are connected to, respectively, the first and second LUT inputs of a corresponding lookup table.

In one embodiment, each field programmable gate array (FPGA) logic cell (logic block) comprises a lookup table having inputs for receiving input data and an output for transmitting an output corresponding to the received input data. The logic cell also includes a respective carry logic unit connected and configured for receiving the input data and for facilitating determination of the output by executing a carry bit generating operation based on the received input data.

Other aspects and advantages of the present disclosure of invention will become apparent from the following detailed description taken in conjunction with the accompanying drawings.

BRIEF DESCRIPTION OF THE DRAWINGS

For a better understanding of the disclosure, reference is made in the following detailed description to the accompanying drawings, in which.

Like reference numerals refer to corresponding parts throughout the drawings.

DETAILED DESCRIPTION

Figure 1:
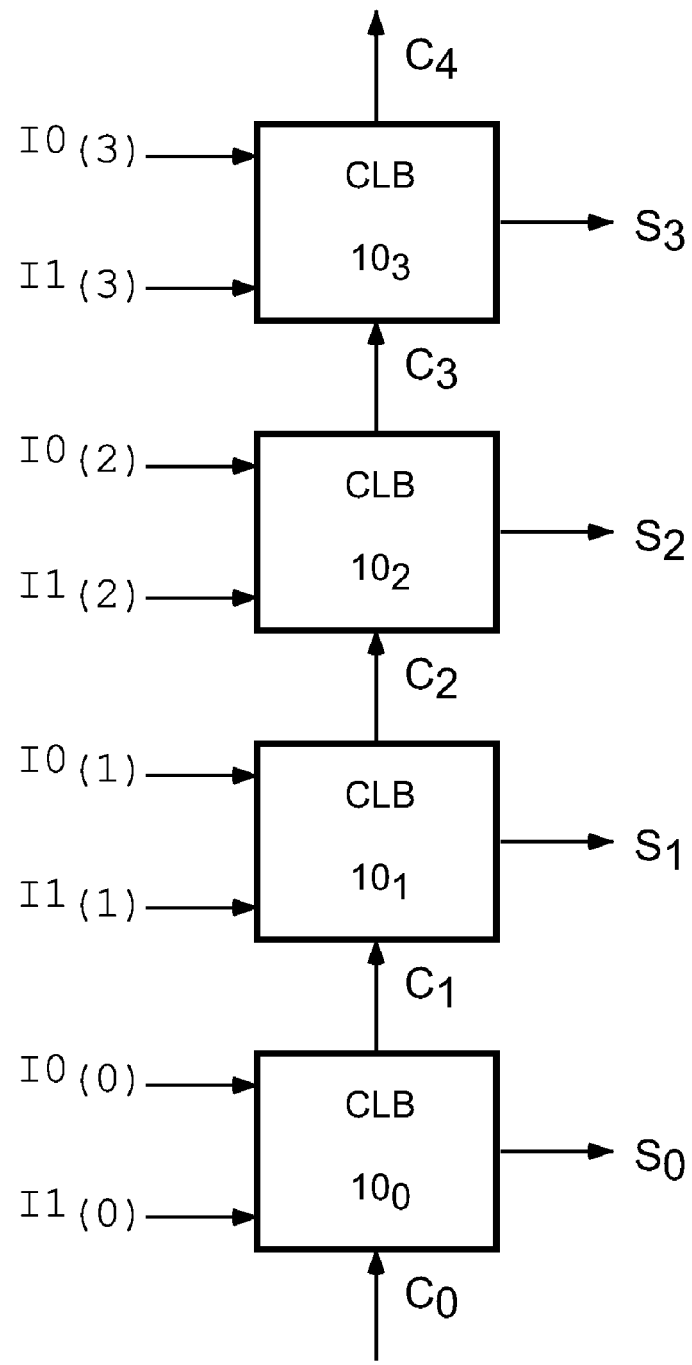
FIG. 1 illustrates FPGA logic blocks implementing a conventional ripple carry adder.
Figure 2:
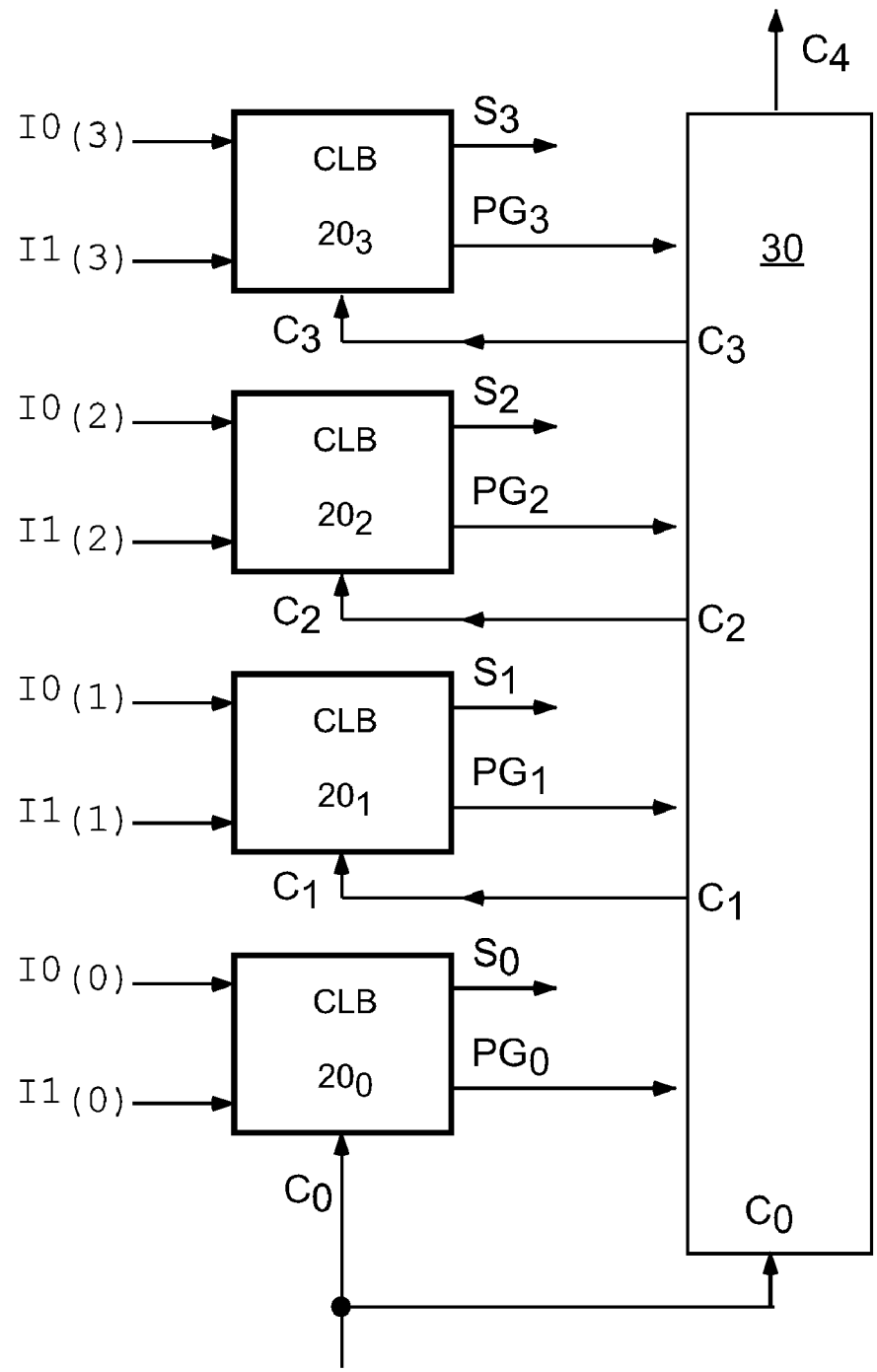
FIG. 2 illustrates FPGA logic blocks implementing a conventional carry look ahead adder.

In contrast to conventional FPGA designs where carry logic couplings such as those shown in FIGS. 1-2 provide opportune paths for undesired static current leakage, embodiments in accordance with the present disclosure include a carry chain design whose stages (carry logic units) can be selectively depowered so as to avoid exhibiting significant leakage current when so depowered. In particular, in one embodiment, units of the carry chain (or even a subset of parts within the carry chain) can be switched on/off (empowered and depowered) when desired. In this manner, carry chains can have their leakage currents substantially disabled when they are not in use, thus saving power.

Additionally, the here disclosed embodiments employ a carry chain whose logic operations (carry bit generating operations) are independent from sum bit generating operations carried out in parallel by other parts of the logic blocks. More specifically, the carry bit generating operations of the carry logic stages (units) are dependent only on the received input data that is to be added, rather than being dependent on latent data output from other parts (e.g., LUTs, flip flops) of the logic blocks. Such a configuration reduces latency by allowing the carry chain to operate directly and immediately on the received input data without need to wait on results from the other parts of the logic blocks. In other words, the carry chain; when empowered, can perform its carry bits generating operations in parallel with, rather than in serial dependency on, the sum bits generating operations of the other parts (e.g., LUTs, flip flops) of the logic blocks.

Figure 3:
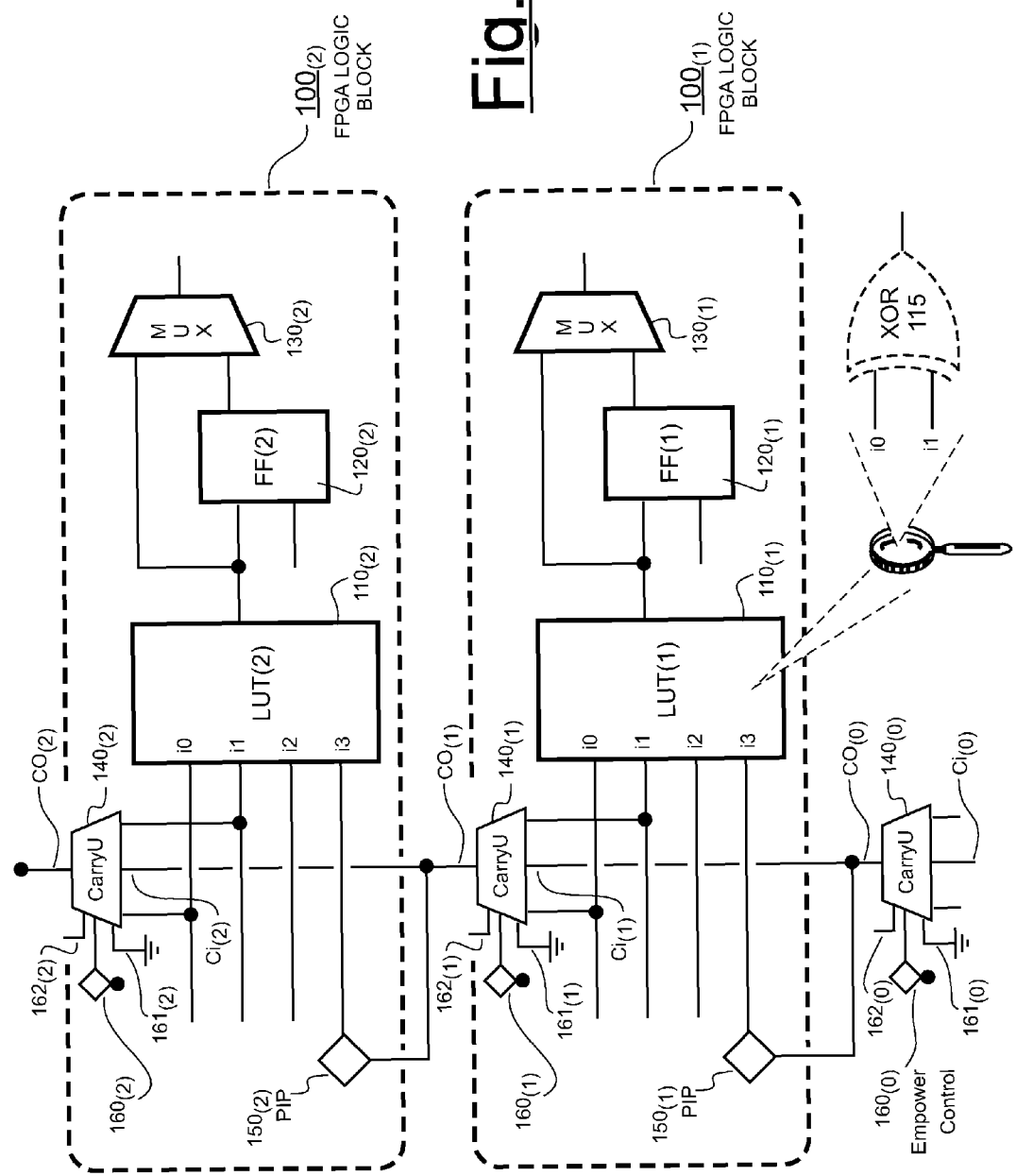
FIG. 3 illustrates FPGA logic blocks organized in accordance with an embodiment of the present disclosure.

FIG. 3 illustrates an FPGA having plural FPGA logic blocks 100 constructed and interconnected in accordance with an embodiment of the present disclosure. Each logic block $100_{(k)}$ includes a corresponding lookup table (LUT) $110_{(k)}$ (where k=0, 1, 2, etc.) with respective inputs i0, i1, i2, and i3, as well as a corresponding flip-flop $120_{(k)}$, and multiplexer $130_{(k)}$. The LUT 110 receives input data through its inputs i0-i3, performs its programmed lookup operations on the input data, and sends the resultant output to a first input of the multiplexer 130 and to an input of the flip-flop 120, whereupon a second input of the multiplexer 130 receives the output of the flip-flop 120.

Each logic block $100_{(k)}$ also includes a respective carry logic unit $140_{(k)}$, which unit receives the same data signals that are received by LUT inputs i0 and i1 of that block, and which unit receives a respective carry input bit, $Ci_{(k)}$, which input bit is also the carry output bit $CO_{(k-1)}$ from the preceding carry logic unit $140_{(k-1)}$. The respective carry logic unit $140_{(k)}$ of FPGA logic block $100_{(k)}$ performs a carry bit generating operation that determines an appropriate carry bit state, and sends the corresponding output signal $CO_{(k)}$ to input i3 of the next LUT $110_{(k+1)}$ in the chain, where that next LUT $110_{(k+1)}$ corresponds to the next more significant bit. When being transmitted to input i3 of the next LUT $110_{(k+1)}$, the CO signal is transmitted through a corresponding programmable interconnect point (PIP) $150_{(k+1)}$ of that input i3 of the next LUT $110_{(k+1)}$. The on/off state (empowered/depowered state) of the respective carry logic unit $140_{(k)}$ is controlled by respectively associated, empowerment-controlling programmable point $160_{(k)}$. In known fashion within the FPGA arts, the various FPGA logic blocks 100 shown in FIG. 3 can contain/utilize various programmable points and/or configuration bits, including those shown as well as others that are not shown (not shown so as to avoid illustrative clutter). Each such programmable point and/or configuration bit is typically programmed prior to operation, often on power up, and it accordingly controls the configuration of various blocks or portions thereof.

When a given LUT $110_{(k)}$ is programmably configured to perform an addition or subtraction operation on the input data received at respective inputs i0, i1 and i3 of its corresponding $LUT_{(k)}$, the associated carry logic unit $140_{(k)}$ is first turned on via the programmable point $160_{(k)}$. Based on the received inputs, i0, i1 and $Ci_{(k)}$, the carry logic unit $140_{(k)}$ then determines whether a true or false carry is required and, if so, sends the corresponding bit as a $CO_{(k)}$ signal to the LUT $110_{(k+1)}$ corresponding to the next more significant bit of the chain. That is, by locating the carry chain units $140_{(k)}$, $140_{(k+1)}$, etc. on the inputs receiving side of the LUTs 110, the illustrated design allows all carry bits to be determined as settled ones (valid ones) of the input data signals, i0, i1 are received; thus reducing delay due to wait times for generated input signals to settle.

Figure 4:
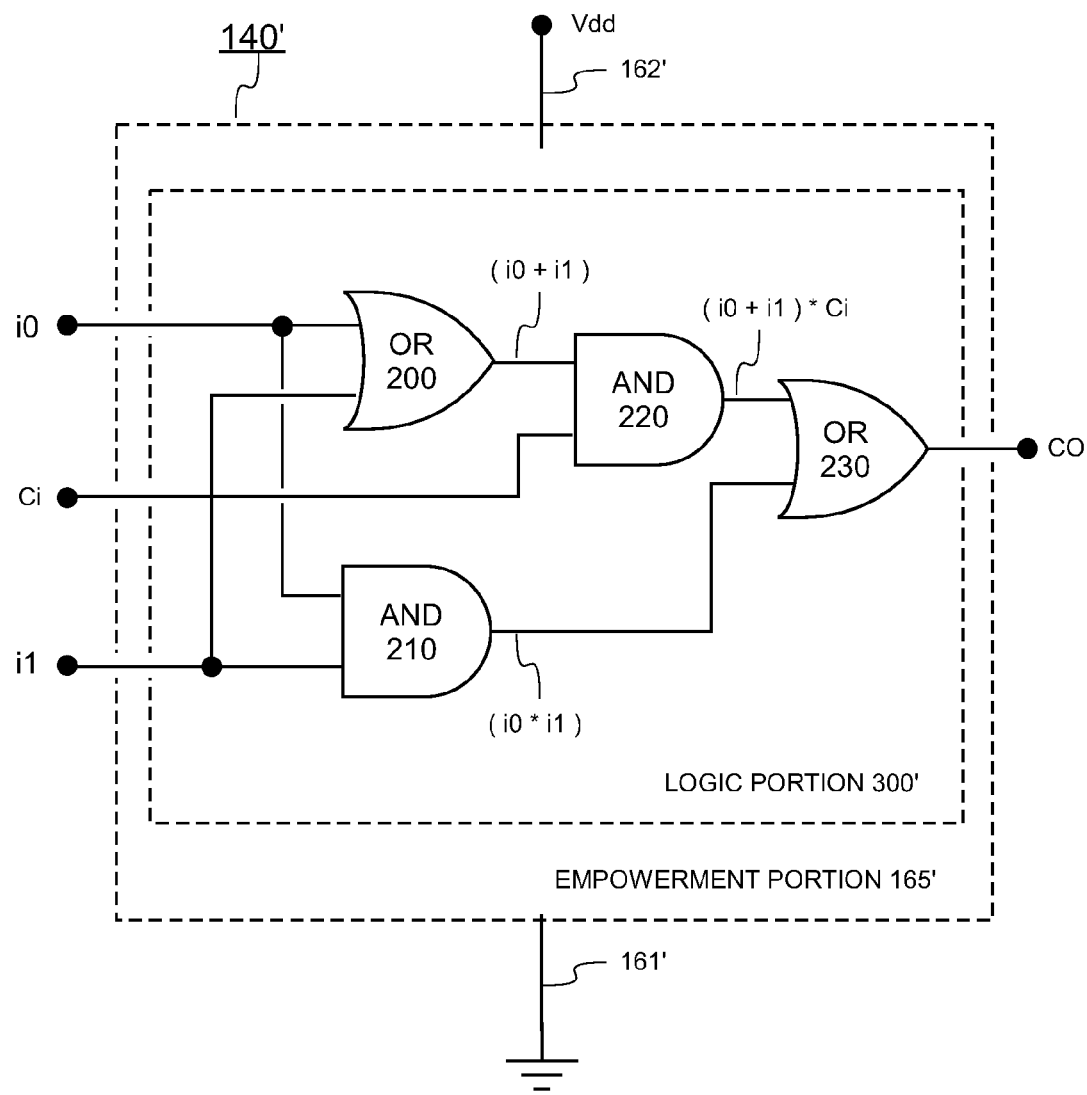
FIG. 4 illustrates details of a carry logic unit that may be employed in the carry chains of FIG. 3.

Various methods for carrying out the carry bit generating operations within logic portions of the carry logic unit 140 and for thus determining the appropriate carry bit, i.e. determining the correct value of CO, are known in the digital logic arts. FIG. 4 illustrates one exemplary embodiment detailing the logic which may be implemented in the logic portions 300' of the illustrated carry bit determining units 140'. Here in FIG. 4, OR gate 200 and AND gate 210 perform their respective logical operations on input signals I0 and I1, and send their outputs respectively to AND gate 220 and OR gate 230. AND gate 220 performs an AND operation with the output of OR gate 200 and the input signal Ci (i.e., the carry bit output from the preceding carry logic unit $140_{(k-1)}$). OR gate 230 then operates on the outputs of AND gate 220 and AND gate 210, and the output of OR gate 230 is the output signal CO of carry logic unit 140'. In this manner, each carry logic unit such as the illustrated unit 140' performs the operation CO= (I0*I1)+I0*Ci+I1*Ci. The present disclosure contemplates alternate carry logic units 140 that perform a carry bit generating operation in any otherwise known manner.

Once the carry logic units $140_{(k)}$ perform their respective carry bit generating operations, they send their corresponding output signals $CO_{(k)}$ to both the next more significant carry logic unit $140_{(k+1)}$ in the chain, and to the corresponding next LUT $110_{(k+1)}$ in the chain as is illustrated for example in FIG. 3. In the embodiment of FIG. 3, the CO signal of each given carry logic unit $140_{(k)}$ becomes the $Ci_{(k+1)}$ signal of the next carry logic unit $140_{(k+1)}$ in the chain, and the CO signal of each given carry logic unit $140_{(k)}$ is also sent to the I3 input of the next LUT $110_{(k+1)}$, via the associated programmable interconnect point 150. Each LUT 110 then applies the value of the received carry bit (i.e., the CO signal supplied to its input I3) to its addition/subtraction operation, perhaps by internally implementing an XOR gate function as part of its lookup functions (XOR gate function shown in phantom at 115 in FIG. 3) where the internally implemented XOR gate function 115 has for example, I0 and I1 as its inputs, and where the LUT output is stored (as is indicated in FIG. 3) in flip-flop 120 for being optionally later fed back as part of an accumulated result to the I0 input of the same LUT 110 after having been registered in the flip-flop 120. The carry logic unit 140 then utilizes this new I0 value as a received i0 signal in the next round of operations that determine the carry value to be sent to the next more significant bit. Since the correct i3 signal is received by each LUT $110_{(k+1)}$ shortly after the preceding carry logic unit $140_{(k)}$ has received its inputs, has quickly generated the corresponding carry bit $CO_{(k)}$ and has transmitted it through PIP $150_{(k+1)}$ to LUT $110_{(k+1)}$, then accordingly and in this manner, each LUT $110_{(k+1)}$ can quickly and correctly take into account the carry signal rapidly provided thereto from the preceding less significant digit stage. In a later operation, it can receive an accumulated new value of I0 (e.g., through an appropriately configured FPGA interconnect network (not fully shown but of which PIP 150 is a member)) so that the correct carry value is sent to the next more significant bit in a next round of register-supported adding. Additionally, given that the carry logic units 140 and XOR gate functions (e.g., 115) of each LUT 110 operate on the input data without reliance on any other time-delayed computational results, the configuration of FIG. 3 allows for rapid determination of carry values without need to wait for each LUT 110 to carry out its calculations before a next carry bit generating operation can take place. The configuration of FIG. 3 thus allows for faster addition/subtraction operations in the illustrated logic blocks 100 than was possible with the configurations of FIGS. 1 and 2 wherein carry bit generation relied on passing received input signals through the CLB-internal LUTs (not shown).

It should be noted that LUT 110 is shown in FIG. 3 as being a 4-input LUT. However, the present disclosure contemplates any hardware suitable for use in FPGA logic blocks 110, including LUTs having any other number of inputs, so long as the various inputs of LUTs in each CLB $100_{(k)}$ can be connected to the inputs of the respective carry logic units $140_{(k)}$ and to the outputs of the preceding carry logic units $140_{(k-1)}$ so that appropriate sum bits $S_{(k)}$ can be produced.

Figure 5:
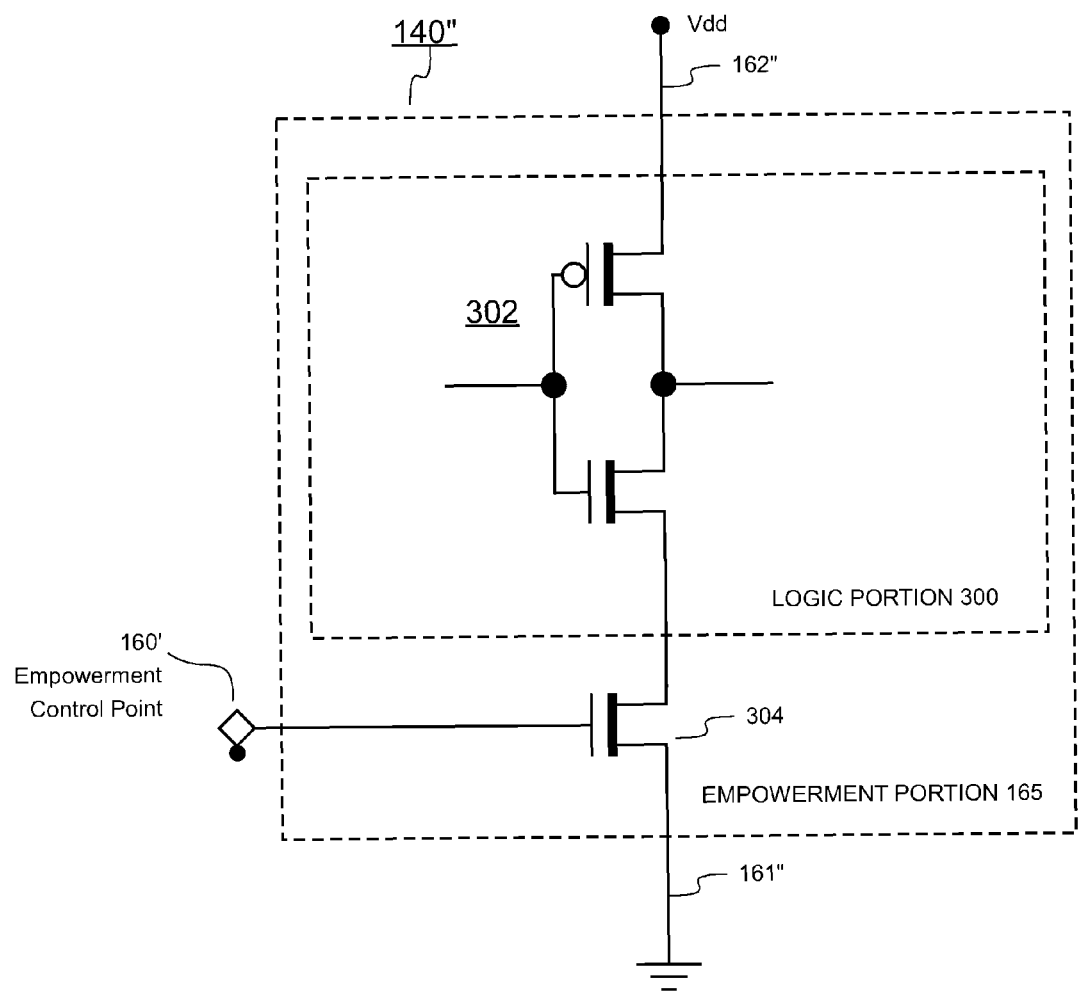
FIG. 5 illustrates details of a selective unit empowering/depowering switch circuit that may be used in the carry chain units employed in FIGS. 3 and 4.

As described above, each carry logic unit $140_{(k)}$ can also be selectively switched on (empowered) when needed (i.e., when an addition/subtraction operation is to be performed), and off (depowered) when not needed. FIG. 5 illustrates details of one embodiment 140" having a carry bit generating logic portion 300 and a selective empowerment portion 165, where the embodiment 140" may be used in a carry chain to implement the selective depower/empower feature. The illustrated carry logic unit 140" includes the mentioned, carry bit generating logic portion 300 which is configured for executing the above described carry bit determining operation. The carry bit generating logic portion 300 may include any logic required for the carry bit generating operation, such as for example the logic portion 300' shown in FIG. 4. In FIG. 5, the logic portion 300 includes elements such as an inverter 302 connected between a drain voltage source terminal 162" (VDD) and a ground sink terminal 161", although the present disclosure contemplates logic 300 that can include any elements or devices that can be appropriately used in carry bit generating operations of the indicated logic portion 300.

In FIG. 5, a unit empowering/depowering switching transistor 304 is placed between logic portion 300 and sink terminal 161" that connects to ground, so that current flowing from VDD to ground runs through the unit empowering/depowering switching transistor 304. In particular, when the logic portion 300 is not being used for carry bit generating operations, this VDD to ground current can be a power-wasting leakage current that flows from VDD to ground even though the logic portion 300 is not in active operation. The illustrated unit empowering/depowering switching transistor 304 has a gate terminal connected to the corresponding, empowerment-controlling programmable point 160, as shown, where the latter programmable point 160 supplies the unit empowering/depowering signal to the gate terminal of transistor 304. In this manner, programmable control supplying point 160 can be used to selectively apply an appropriate control voltage to the gate terminal of the unit empowering/depowering switching transistor 304 for selectively empowering or depowering the corresponding carry bit generating unit 140". When an empowering gate voltage is applied, switching transistor 304 allows current to pass from VDD, through any intervening logic portion 300, to ground, thus empowering the carry logic unit 140". When programmable point 160 switches off this empowering gate voltage, the unit empowering/depowering switching transistor 304 interrupts this current, effectively switching off power delivery to the logic portion 300 of the carry logic unit 140". In this manner, it can be observed that power flow through carry logic unit 140" can be switched off whenever such a carry chain unit is not needed, to thus prevent leakage currents from flowing in unused portions of the carry chain. Such switching can occur via programmable point 160 or any other appropriate hardware by way of which an appropriate unit empowering/depowering voltage can be applied to the gate terminal of transistor 304.

While FIG. 5 indicates that leakage current (or other current) is being selectively disabled via operation of the unit empowering/depowering switching transistor 304, the present disclosure contemplates any switching device or devices capable of switchably cutting off delivery of empowering power to the logic portion 300 of the carry logic unit 140". Similarly, while a single unit empowering/depowering switching transistor 304 is shown, the present disclosure contemplates any number of such transistors 304, positioned between the power supply terminal(s) 162" (VDD) of the carry logic unit 140" and its ground sink terminal(s) 161" so as to switchably interrupt flow of current through the logic portion 300 of the carry logic unit 140". Likewise, a switching transistor like 304 (or any other appropriate switching device) can be employed between the sink terminal 161" that connects to ground and any other component of the logic portion 300 of the carry logic unit 140". For example, a gate(s) empowering/depowering switching transistor can be placed between ground and any one or more of the components 200-230 of FIG. 4.

The foregoing description, for purposes of explanation, used specific nomenclature to provide a thorough understanding of exemplary embodiments in accordance with the present disclosure of invention. However, it will be apparent in light of the foregoing to one skilled in the art that the specific details are not required in order to practice the underlying teachings of the present disclosure. In the illustrated exemplary instances, well known components (e.g., LUTs, PIPs, flip flops, MUXs, Boolean logic gates) are shown in block form in order to avoid unnecessary distraction from the underlying teachings. Thus, the foregoing descriptions of specific embodiments are presented for purposes of illustration and description. They are not intended to be exhaustive or to limit the present disclosure of invention to the precise forms disclosed. Rather, many modifications and variations are possible in view of the above teachings. For example, the present disclosure contemplates carry logic utilizing any structures or devices capable of executing arithmetic carry operations properly. Similarly, a unit empowering/depowering switching transistor or other power interrupting switching device(s) can be placed anywhere appropriate to selectively cut off leakage current that may otherwise flow through the carry logic unit 140" when not in use, such as at the head, foot, or any point in between of the power flow path of the carry logic unit 140". The various drawings are not necessarily to scale. The embodiments were chosen and described in order to best explain the principles of the present disclosure of invention and its practical applications, to thereby enable others skilled in the art to best utilize the present teachings and various embodiments with various modifications as are suited to the particular use contemplated.

What is claimed is:

1. A field programmable gate array (FPGA), comprising:
    carry logic unit having a logic portion configured to execute a carry bit generating operation, the carry logic unit comprising an empowerment portion having a power voltage supplying terminal and a power sinking terminal, the empowerment portion being structured to support flow therethrough of an empowering current flowing through and empowering the carry bit generating operations of the logic portion of the carry logic unit when said carry bit generating operations are active, the empowering current flowing from the power voltage supplying terminal to the power sinking terminal;
    wherein the empowerment portion of the carry logic unit includes a unit empowering/depowering switching transistor connected to the power sinking terminal of the carry logic unit and structured and disposed so as to support flow of the empowering current through the switching transistor; and
    a programmable, empowerment/depowerment control signal provider connected to a gate terminal of the switching transistor and programmably configurable to provide depowering control signal to the gate terminal which causes the empowering/depowering switching transistor to interrupt the flow of the empowering current through the logic portion of the carry logic unit such that flow of leakage current through the logic portion is disabled when the flow of the empowering current is interrupted in response to provision of the depowering control signal to the gate terminal.

2. The FPGA of claim 1, wherein the leakage current is disabled when the carry logic unit is not being used.

3. The FPGA of claim 1,
    wherein a first input bit supplied to the first input terminal of the carry logic unit is denoted as an i0 input, a second input bit supplied to the second input terminal of the carry logic unit is denoted as an i1 input, an output bit output from the output terminal of the carry logic unit is denoted as a CO output, and a third input bit supplied to the third input terminal of the carry logic unit is denoted as a Ci input; and
    wherein the carry logic unit is further configured to perform a carry bit generating function denoted by the Boolean expression:

$$CO = i0 * i1 + i0 * Ci + i1 * Ci.$$

4. A field programmable gate array (FPGA) having a plurality of configurable logic blocks (CLBs) each comprising: a lookup table (LUT) having first and second data input terminals connected to receive respective first and second data signals transmitted thereto as inputs usable by a lookup function implemented in the LUT, and an output terminal for outputting a LUT result signal that is generated by the LUT based on the implemented lookup function of the LUT; and carry logic unit configured to perform carry bit generating operations that produce carry bits corresponding to carry input signals received by the carry logic unit, the carry logic unit having first, second and third carry logic input terminals for receiving the carry input signals and a carry output terminal for outputting the produced carry bits; wherein the first and second carry logic input terminals of the carry logic unit are connected respectively to the first and second data input terminals of the lookup table, wherein the plurality of configurable logic blocks (CLBs) includes a first CLB and a second CLB; wherein the respective lookup tables of the CLBs each includes a respective third data input terminal connected to receive respective third data signal transmitted thereto as an input usable by the respective lookup function implemented in the corresponding LUT of the respective CLB; and wherein the carry output terminal of the carry logic unit of the first CLB is programmably connectable to the third input terminal of the lookup table of the second CLB.

5. The FPGA of claim 4, wherein the lookup table is a 4-input lookup table.

6. The FPGA of claim 4:
    wherein the respective lookup table of each CLB that participates in an arithmetic summation process has implemented as part of its respective lookup function, an exclusive OR function (XOR function).

7. The FPGA of claim 4:
    wherein the plurality of configurable logic blocks (CLBs) includes a first CLB and a second CLB; and
    wherein the third carry logic input terminal of a respective carry logic unit in the second CLB is connected to the respective carry output terminal of the respective carry logic unit in the first CLB.

8. A field programmable gate array (FPGA) circuit comprising:
    a plurality of programmable lookup tables (LUTs) each having a respective LUT output terminal and respective first, second and third LUT input terminals disposed for receiving corresponding first, second and third LUT input term signals of the respective LUT;
    a carry bits generating chain having a plurality of carry bit generating units, each carry bit generating unit being associated with one of the LUTs and each carry bit generating unit having a respective unit output terminal and respective first, second and third carry unit input terminals disposed for receiving corresponding first, second and third carry input term signals of the respective carry bit generating unit, where the third carry unit input terminal of each carry bit generating unit in a continuous portion of the chain is connected to the unit output terminal of the previous unit in the chain,
    wherein the first and second carry unit input terminals of each unit are coupled to receive same respective first and second input signals as corresponding first and second LUT input terminals of the associated LUT, and
    wherein each carry bit generating unit includes a power cut off circuit configured to selectively cut off power consumption of a carry bit generating logic portion of the unit in response to a received depowering control signal, which depowering control signal is indicative of the respective carry bit generating unit not being used for carry bit generation.

9. The FPGA circuit of claim 8 wherein:
the first and second carry unit input terminals of each unit are coupled to receive said same respective first and second input signals at a same time as they are received by the corresponding first and second LUT input terminals of the associated LUT.

10. The FPGA circuit of claim 8 wherein:
the third LUT input terminal of each given LUT is programmably couplable by way of a programmable coupling point to the unit output terminal of a carry bit generating unit associated with a different LUT.

11. The FPGA circuit of claim 10 wherein:
the depowering control signal is supplied to the power cut off circuit of each respective carry bit generating unit from a programmable control signal supplying point of the FPGA circuit.

12. The FPGA circuit of claim 11 wherein:
each carry bit generating unit has its own respective programmable control signal supplying point for supplying the corresponding depowering control signal of the respective carry bit generating unit.

13. The FPGA circuit of claim 11 wherein:
the power cut off circuit of each given carry bit generating unit includes a unit empowering/depowering switching transistor connected such that a power supplying current of the unit flows through the unit empowering/depowering switching transistor.

14. The FPGA circuit of claim 13 wherein:
the unit empowering/depowering switching transistor has a source terminal connected to a current sinking terminal of the given carry bit generating unit.

15. The FPGA circuit of claim 13 wherein:
each carry bit generating unit includes a logic portion configured to carry out a respective carry bit generating operation corresponding to the Boolean logic equation:

$CO = i0*i1 + i0*Ci + i1*Ci$ wherein CO is an output bit output by the respective unit output terminal, Ci is a carry input bit received by the third carry unit input terminal of the respective carry bit generating unit, and i0 and i1 are respective first and second addend bits respectively received by the first and second carry unit input terminals of the respective carry bit generating unit.

16. The FPGA circuit of claim 8 wherein:
each LUT has a respective fourth LUT input terminal disposed for receiving a corresponding fourth LUT input term signal of the respective LUT.

17. A field programmable gate array (FPGA) circuit comprising:
a plurality of programmable lookup tables (LUTs) each having a respective LUT output terminal and respective plurality of LUT input terminals disposed for receiving corresponding one of plural LUT input term signals of the respective LUT;
a carry bits generating chain having a plurality of carry bit generating units, each carry bit generating unit being associated with one of the LUTs and each carry bit generating unit having a respective unit output terminal and respective first, second and third carry unit input terminals disposed for receiving corresponding first, second and third carry input term signals of the respective carry bit generating unit, where the third carry unit input terminal of each carry bit generating unit in a continuous portion of the chain is connected to the unit output terminal of the previous unit in the chain,
wherein each carry bit generating unit includes a power cut off circuit configured to selectively cut off power consumption of a carry bit generating logic portion of the unit in response to a received depowering control signal, which depowering control signal is indicative of the respective carry bit generating unit not being used for carry bit generation.

18. The FPGA of claim 17 wherein:
the power cut off circuit of a given one of the carry bit generating units is configured to selectively cut off power consumption by at least an output circuit portion of the given one carry bit generating unit where the output circuit portion directly outputs to the respective unit output terminal of the given one carry bit generating unit.

* * * * *